(12) United States Patent
Sweegers et al.

(10) Patent No.: US 10,728,968 B2
(45) Date of Patent: Jul. 28, 2020

(54) MULTI-MODE POLARIZED SPOT WITH ELECTRICALLY ADJUSTABLE POLARIZATION STATE

(71) Applicant: SIGNIFY HOLDING B.V., Eindhoven (NL)

(72) Inventors: Norbertus Antonius Maria Sweegers, Lierop (NL); Marc Andre De Samber, Lommel (BE); Hugo Johan Cornelissen, Escharen (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/470,231

(22) PCT Filed: Dec. 7, 2017

(86) PCT No.: PCT/EP2017/081883
§ 371 (c)(1),
(2) Date: Jun. 16, 2019

(87) PCT Pub. No.: WO2018/114368
PCT Pub. Date: Jun. 28, 2018

(65) Prior Publication Data
US 2019/0313494 A1    Oct. 10, 2019

(30) Foreign Application Priority Data
Dec. 20, 2016 (EP) ..................... 16205218

(51) Int. Cl.
*G02B 5/30*    (2006.01)
*H05B 45/00*   (2020.01)
(Continued)

(52) U.S. Cl.
CPC ............. *H05B 45/00* (2020.01); *F21K 9/233* (2016.08); *F21V 7/04* (2013.01); *G02B 5/3025* (2013.01);
(Continued)

(58) Field of Classification Search
None
See application file for complete search history.

(56) References Cited

U.S. PATENT DOCUMENTS

| 8,953,926 B1 * | 2/2015 | Kelly ................... H05B 33/02 362/335 |
| 8,957,428 B2 | 2/2015 | Jagt et al. |

(Continued)

FOREIGN PATENT DOCUMENTS

| EP | 1580594 A2 | 9/2005 |
| EP | 2657760 A1 | 10/2013 |

(Continued)

*Primary Examiner* — Dedei K Hammond
(74) *Attorney, Agent, or Firm* — Daniel J. Piotrwoski

(57) ABSTRACT

The invention provides a lighting device (100) comprising a plurality of light source packages (110) each light source package (110) comprising a light source (10) and a polarizer (20) configured to polarize light source light (11) of said light source (10), wherein the light source packages (110) are individually controllable, wherein the light source packages (110) are configured to provide polarized light source light (11) with at least two different polarization states (p1,p2), and wherein the light source packages (110) share a light exit window (120) for escape of the light source light (11) from said lighting device (100).

13 Claims, 6 Drawing Sheets

(51) Int. Cl.
*F21K 9/233* (2016.01)
*F21V 7/04* (2006.01)
*H01L 25/075* (2006.01)
*F21Y 115/10* (2016.01)

(52) U.S. Cl.
CPC ....... H01L 25/0753 (2013.01); *F21Y 2115/10* (2016.08)

(56) References Cited

U.S. PATENT DOCUMENTS

| | | | | |
|---|---|---|---|---|
| 2008/0057278 | A1* | 3/2008 | Benson | B32B 5/26 428/212 |
| 2008/0128728 | A1 | 6/2008 | Nemchuk et al. | |
| 2009/0268460 | A1* | 10/2009 | Van Gorkom | H01L 25/0753 362/244 |
| 2011/0006707 | A1* | 1/2011 | Baaijens | H05B 33/0863 315/307 |

FOREIGN PATENT DOCUMENTS

| | | |
|---|---|---|
| JP | 5655423 B2 | 2/2012 |
| WO | 2014180718 A1 | 11/2014 |

\* cited by examiner

MULTI-MODE POLARIZED SPOT WITH ELECTRICALLY ADJUSTABLE POLARIZATION STATE

CROSS-REFERENCE TO PRIOR APPLICATIONS

This application is the U.S. National Phase application under 35 U.S.C. § 371 of International Application No. PCT/EP2017/081883, filed on Dec. 7, 2017, which claims the benefit of European Patent Application No. 16205218.7, filed on Dec. 20, 2016. These applications are hereby incorporated by reference herein.

FIELD OF THE INVENTION

The invention relates to a lighting device for providing polarized light. The invention further relates to a lighting system comprising such lighting device.

BACKGROUND OF THE INVENTION

Polarized light-emitting devices are known in the art. US 2008/0128728, for instance, describes a light-emitting device comprising a light-emitting material stack including a light-generating region and a light emission surface, and a polarizer configured to receive at least some light emitted from the light emission surface of the light-emitting material stack, wherein the polarizer comprises first reflective regions at a first height and second reflective regions separated from the first metal regions and at a second height different from the first height.

SUMMARY OF THE INVENTION

Observation of objects with polarized light appears to results in a different perception of the object. Polarized light appears to influence the perceived contrast, color experience, and it appears to strongly reduce reflections (e.g. reflection of a water surface). This is the result of the different optical properties of the illuminated material and interfaces for the different polarization directions. To create polarized light for illumination, polarized light may be generated by applying a polarizing filter between the light source and the object. To next modify the initial polarization direction of such light source+polarizer, the polarizer is mechanically rotated. Alternatively, the source is switched off and another polarizing light source is switched on instead for obtaining the new polarization direction, thus requiring multiple spots/luminaires.

Hence, it is an aspect of the invention to provide an alternative lighting device and/or lighting system, which preferably further at least partly obviate(s) one or more of above-described methods of creation of polarized light with their drawbacks.

Herein, amongst others a lighting device (or luminaire) is proposed with integrated multiple (white) LED sources with different polarization states (e.g. directions) on micro-level. In embodiments, the individual polarization states can be independently electrically addressed and collimated with preservation of the initial polarization. With this multiple polarization state light spot the polarizing direction can be electronically changed without the need for (mechanical) rotating parts and without loss of light intensity. Because the polarization in our invention is realized on micro level and the direction is selected electronically, the light polarization state can be modulated or changed dynamically.

Especially, the invention provides a spot generating polarized light with a tunable polarization state realized by electronic addressable driving. Solutions for optics capable to maintain the polarized direction of the light comprise e.g. reflector optics and/or non-birefringent refractive optics. Especially, the polarization is realized close to the LED using a metal wire reflective polarizer, which may also enable in combination with the chosen reflector to realize small aspect ratios (small collimation optics and spot size) with high efficiency. The small size based upon polarizing on LED level allows the polarizing spot to be mounted in a standard fixture. Further, the small size of the assembly allows near-embedded use of the source in the application, so replacing the otherwise very obtrusive large spot projectors in e.g. a storefront.

Further, an electrically and potentially remote addressability of the multi-direction polarized light source may allow tuning the source as wished by a user (or as assumed to be wished by a customer). For instance, a shop owner can stand in front of the window shop and set a scene in the most realistic way, and modify at any time depending on e.g. the goods that needs to be highlighted (e.g. clothing), the ambient light conditions (e.g. level of sunshine on a window shop), time of day, type of expected customers (e.g. afternoon versus weekend clothing shoppers), etc.

The invention allows the option to apply different modes for driving the LED. For instance, individual polarization modes may be chosen to a fixed direction, for instance tuning the polarization mode to a scene that fit best with the application. This may e.g. be used in stores to reduce the foil reflections of pre-packed meat, vegetables, clothing, etc., or e.g. setting a scene in a clothing shop, e.g. for minimizing reflection on a vitrine window, e.g. for minimizing reflection of foil packed objects in showcase, etc. etc. Further and alternatively, the invention may be used for modulating the polarization modes (especially state) to create dynamic, appealing and attracting effects. When modulating polarization in which an equal overall light intensity is maintained, polarization based effects may be obtained without essential disturbance due to intensity changes. Further, the invention may provide the advantage of the addressable and dynamic character of LED light sources resulting in a wide range of options for dynamic optical effects, freely programmable in signal shape, sequence, frequency, phase delay and intensity. Yet further, also additional intermediate polarizing directions can be realized by different rotational positions of the individual units. Further, the invention provides a polarized LED based light source where the polarization may be realized with a metal grid polarizer platelet, applied on a solid state light source die or near the die. This may e.g. allow pre application of a metal grid polarizer on a carrier which has a small x-y size, thus maintaining high brightness. Further, the amount of light escaping sideways from the metal grid carrier (usually a glass sheet) is minimized because of the small z-size (thickness). Yet further, metal grid polarizers on glass have a high temperature resistance allowing the LED to be driven at high current with the polarizer position on or near the heat dissipating LED die. Hence, with the invention polarization may be realized close to the LED. Multiple polarization states can be realized by multiple LEDs using the same (type of) (next level) optics in one luminaire ("lighting device") embodiment, resulting in the preferred overlap and hence stability of the combined light beam. Hence, the invention provides device which provides the multiple polarized beams through one secondary optics, whereby the beam shape is essentially fixed and stable, as compared to the result if multiple beams from multiple geometrically separated luminaires (with individual beams) would be combined into a combined beam pattern.

Hence, in a first aspect the invention provides a lighting device ("device") comprising a plurality of light source packages ("packages") each light source package comprising a light source and a polarizer configured to polarize light source light of said light source, wherein the light source packages are individually controllable, wherein the light source packages are configured to provide (linearly or circularly or in general: elliptically) polarized light with at least two different polarization states, and wherein the light source packages share a light exit window for escape of the light source light from said lighting device. With "different polarization states" it is meant either different states of linearly polarized light, or different states of circularly polarized light, or most generally speaking: different states of elliptically polarized light. Hence, the phrase "different polarization states" may in embodiments refer to different polarization directions. For instance, different polarization states especially mean polarization orientated in different directions. For instance, the combination of light source and polarizer might be identical, but positioned at different angles from the linear axis on the board. The term "state" might thus also refer to circular or linear polarization. Hence, the polarization states of the first light and second light are especially chosen from (both) linear, (both) circular, and (both) elliptical.

With such device, it is possible to control polarization by choosing (i.e. powering) a specific package or a subset of specific packages only. Further, with such device, a single lighting device is used and essentially a single light beam may be produced, of which the polarization state may be controlled. Hence, with such device the appearance of objects under illumination with the device light may further be controlled. Further, such device (or system, see also below) may be used for maintaining a sum of the intensities of the light of the at least two polarization states constant in time but varying the individual intensities in time.

The lighting device comprises a plurality of light source packages. This implies that the device comprises at least two light source packages, such as at least three, like especially at least four. However, more light sources may also be possible. Further, the lighting device may comprise a plurality of subsets of one or more light sources. Hence, a first light source or a first subset may be configured to provide polarized light of a first polarization state, and a second light source or second subset of light source may be configured to provide polarized light of a second polarization state. In the case of linearly polarization states, the first and second polarizations are configured under an angle, such as configured orthogonal. The lighting device may thus comprise n light source packages, wherein n is an integer equal to or larger than 2.

More especially, the lighting device may comprise g*h light source packages, wherein g is equal to 2 or larger, and reflects the number of subsets, and h is 1 or larger, and reflects the number of light source packages belonging to the subsets. Note that not necessarily each subset comprises the same number of light source packages. Especially, g=2, with the light sources in the respective packages having within the package mutually aligned polarizations and, wherein the two subsets in specific embodiments provide light with mutual orthogonal polarizations. The subsets may provide essentially identical light in terms of one or more of intensity, color, color temperature, beam shape, etc. Especially, the light source packages are configured to provide white light source light. However, the invention is not limited to white polarized light. Also colored polarized light may be provided. Especially, the device is herein described with at least two polarization states. The device may thus also be able to provide more than two different polarization states.

Hence, in specific embodiments the lighting device may comprise f*g*h light source packages, wherein g is equal to 2 or larger, and reflects the number of subsets, and h is 1 or larger, and reflects the number of light source packages belonging to the subsets, and f reflects the number of light sources in a subset that are used to generate white light. For instance, two (g=2) subsets of each a red, green and red LEDs (f=3), with only a single of each of such colored LED in a subset (h=1) may be used. Note that these embodiments are provided as specific examples, as all kind of combinations of light source packages can be used to provide white or colored light of which the polarization can be change by selecting the specific light source(s). Hence, in embodiments the lighting device may be configured to provide one or more of white light (in a first mode) and colored light (in a second mode).

Especially, each light source package comprises a light source and a polarizer configured to polarize light source light of said light source. Further, the package may optionally also include a beam shaping element.

The light source especially comprises a solid state light source. The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module.

The lighting device comprises optics to polarize the light and/or choose a specific polarization state. In specific embodiments, one or more polarizers comprise wire grid polarizers. In further specific embodiments, all polarizers are wire grid polarizers. In embodiments, wire grid polarizers may be on the LED die or remote therefrom.

In embodiments the light sources comprise light emitting surfaces (especially LED dies) and the polarizers of one or more light sources, especially of all, are configured at a distance from the respective light emitting surface selected from the range of 0-20 mm.

As indicated above, the light source packages are individually controllable (or controllable in subsets of light source packages). Hence, it is possible to choose lighting device light with different polarizations, dependent upon the choice of the light source packages chosen. Polarization may be chosen by controlling the intensity of the light that is provided by the light source packages, which is based on the intensity of the light of the light source. The intensity may in embodiments be continuously or semi-continuously be changeable, or only be binary changeable (on-off).

Hence, the phrase "wherein the light source packages are configured to provide (linearly or circularly or in general: elliptically) polarized light source light with at least two different polarization states" indicates that it is possible to provide with the lighting device light with a first polarization and light with a second polarization and optionally also light with one or more intermediate polarizations. Hence, the phrase "wherein the light source packages are configured to provide polarized light source light with at least two different polarization states" may amongst others also indicate that different polarizations may be provided consecutively, and/or may amongst others also indicate that the lighting device only provides a single polarization, for instance as that specific polarization is desired for the specific application.

Yet further, the light source packages share a light exit window for escape of the light source light from the lighting device. By sharing a single exit window, the light of the different light sources essentially escapes at a single position from the lighting device. In this way, a single beam is provided. This would not be the case when separate light source packages with separate windows would be used. Hence, a single beam is provided of which the polarization can be controlled. Of course, the invention does not exclude the use of a device with a plurality of beams provided according to the same principle as described herein (in other words, a device or system comprising a plurality of devices as defined herein).

The light source packages may be configured in a number of possible configurations. Amongst others, good results were obtained with light sources that have optical axis which are configured in a (virtual) plane. However, other embodiments may also be possible. Hence, in specific embodiments the light sources have optical axes (configured essentially perpendicular to light emitting surfaces of these light sources), wherein the light sources are configured in a virtual device plane, wherein the optical axes of the light sources are configured non-perpendicular to said device plane. Even more especially, thus, the optical axes are configured in a plane parallel to said virtual device plane. For instance, with two light source packages the optical axes may be configured orthogonal; with e.g. four light sources the optical axes may all be orthogonal, effectively leading to e.g. only two different polarizations.

Therefore, in specific embodiments the lighting device comprises n light source packages, wherein the n light source packages are configured in a configuration with Cn symmetry, and wherein n is an integer of at least 2. Hence, the light source packages may be configured in a rotational symmetric configuration, of 2, 3, 4, or more light source packages, which may all provide light source light that may escape from the shared light exit window. In further specific embodiments, n=2k, wherein k is an even number, and wherein the lighting device are configured to provide two different polarizations. For instance, this may refer to two subsets with k light source packages. However, this may also refer to a plurality of subsets, but which are configured such that only two polarizations of the light can be provided when addressing the one subset or addressing the other subset, and one or more intermediate polarizations when both subsets are addressed. Hence, the phrase "wherein the light source packages are individually controllable" may also refer to embodiments wherein a plurality of subsets of light source packages are individually controllable (wherein the light source packages within the subsets, if more than one per subset, may not necessarily be individually controllable).

In embodiments, especially the plurality of light source packages do not share a single substantially parabolically shaped reflector. More especially, in embodiments each light source package may essentially be configured together with a reflector especially configured for the respective light source package. This may further add to control of the polarization, as with a single conical reflector the polarization may not easily be controlled. Hence, in embodiments one or more light source packages further each comprise a reflector, wherein each of said one or more light source packages and the respective reflector are configured to reflect at least part of the light source light in a direction of the light exit window. Such reflector may comprise a segment of a parabolically shaped reflector.

In embodiments, the light exit window comprises non-birefringent refractive optics. This may be a window of non-birefringent solid material. In specific embodiments, the light exit window comprises one or more of a silicone dome and a lighting device opening. In further specific embodiments, the light source packages are at least partly embedded in the silicone dome. Note that the light exit window may in other embodiments comprise an opening in the device without material. In general, however, there will be a protective window comprising solid material, such as glass or silicone, or a (glass or silicone) dome.

As indicated above, the light source packages are individually controllable. Or as indicated above, the subsets of light source packages are individually controllable. Hence, in yet a further aspect the light sources may be functionally connected with a control system. The control system may be comprised by the lighting device or may be configured external from the lighting device.

It may also be possible that the lighting device comprises a slave control system, to be controlled by an external master control system. Hence, in yet a further aspect the invention also provides a lighting system ("system") comprising the lighting device as defined herein and a control system configured to control the light sources. As specific embodiment of the lighting system, a lighting device comprising the control system is herein proposed. The control system may especially be configured to control the light sources in response to one or more of a sensor signal and user input data.

Therefore, in embodiments the lighting system, or in specific embodiments the lighting device, may further comprise a sensor configured to sense reflection of light from a remote object and configured to generate a corresponding sensor signal, wherein the control system is configured to control the light sources in response to said sensor signal. Alternatively or additionally, in embodiments the lighting system, or in specific embodiments the lighting device, may further comprise a user interface for providing user input data, wherein the control system is configured to control the light sources in response to said user input data.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, etc.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
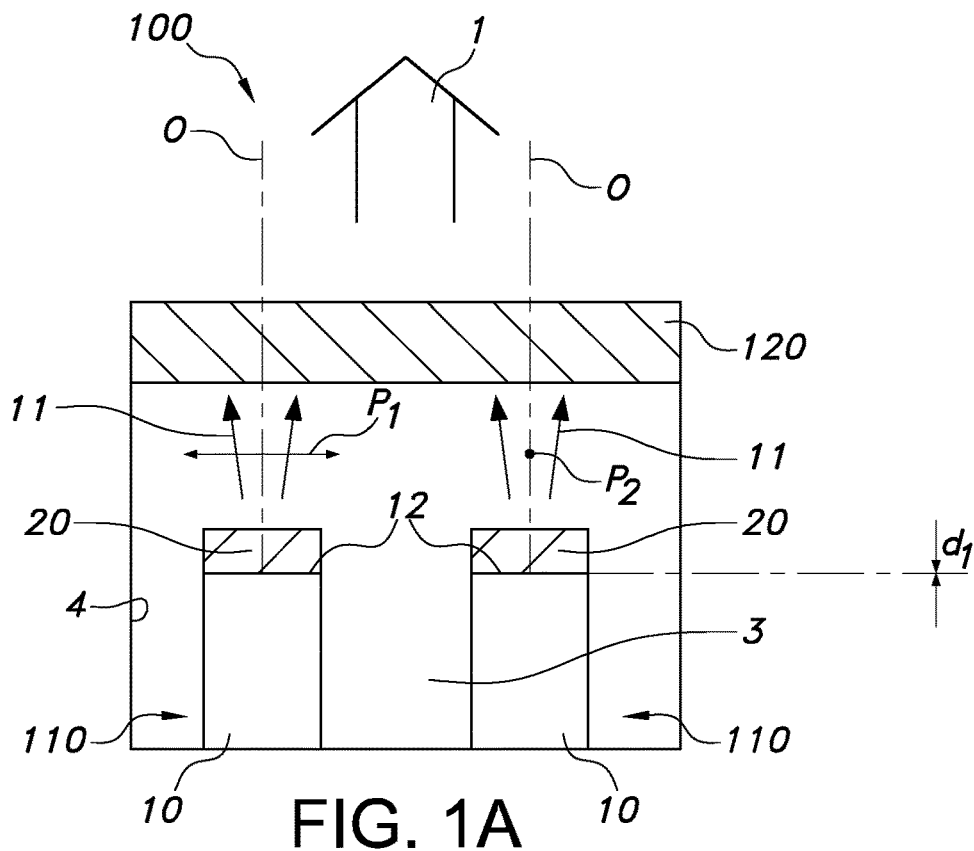
FIGS. 1a-1c schematically depict some embodiments and variants.

FIG. 1a very schematically depicts an embodiment of a lighting device 100 comprising a plurality of light source packages 110. Here, by way of example only two light source packages 110 are depicted. These packages may provide essentially the same light 11, but with different polarizations p1 and p2. Each light source package 110 comprises a light source 10 and a polarizer 20 configured to polarize light source light 11 of said light source 10. Further, the light source packages 110 are individually controllable.

The light source packages 110 are especially configured to provide linearly polarized light source light 11 (with at least two different polarization states p1,p2). Further, the light source packages 110 share a light exit window 120 for escape of the light source light 11 from said lighting device 100. Here, the light exit window 120 comprises a window of solid material, such as glass or silicone. Especially, the solid material is non-birefringent. Distance d1 indicates the distance between the polarizer 20 and a light emitting surface 12 of the light source 10, which distance d1 is selected from the range of 0-20 mm. Here, in this embodiment d1=0 mm. Reference 3 indicates a light cavity, in which light may optionally be recycled, with reflective faces 4. Reference O indicates the optical axis of the light source 10. Here, they are configured parallel, and configured essentially perpendicular to the light exit window 120. The phrase "polarization states p1,p2" indicates especially two states, but may also, such as in the claims, indicate at least to polarization states.

Figure 1B:
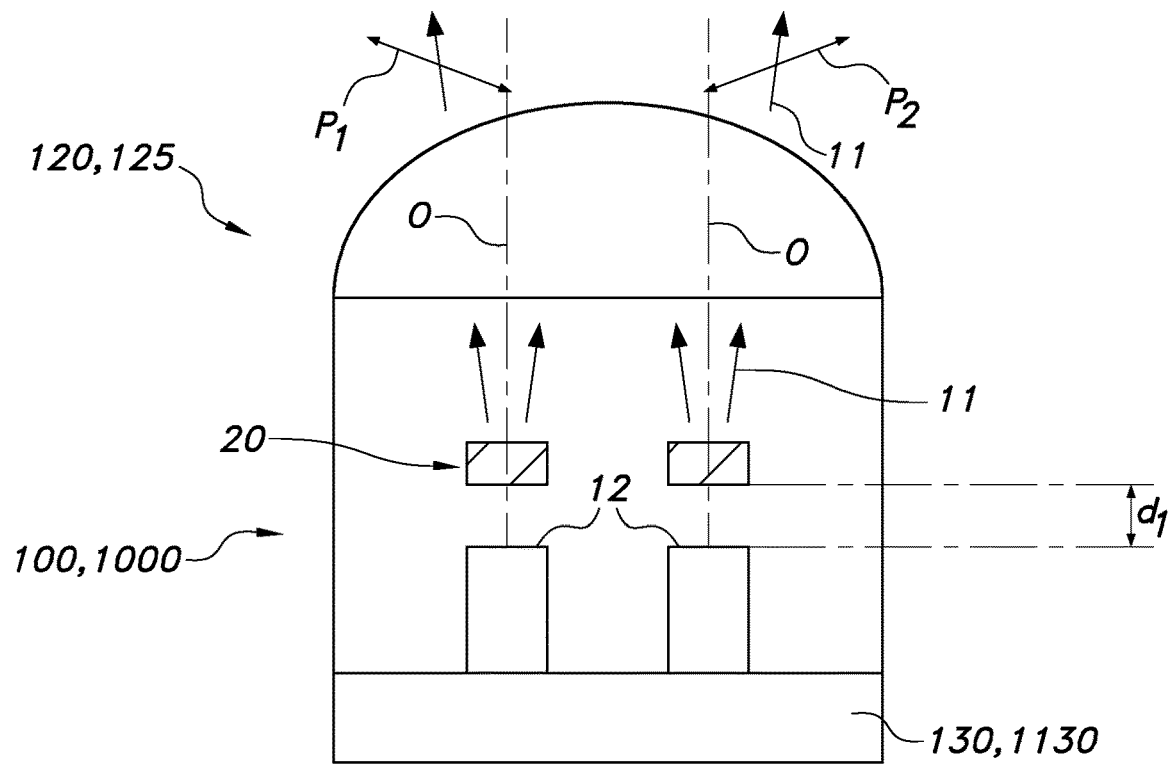

FIG. 1b schematically depicts a more or less similar embodiment. However, by way of example the polarizers 20 are configured at a non-zero distance d1. Further, by way of example the light exit window 120 comprises a (silicone) dome 125. Further, by way of example the lighting device 100 comprises a control system 130. Hence, effectively FIG. 1b also schematically depicts a lighting system 1000. The control system may therefore also be indicated with reference 1130.

Figure 1C:
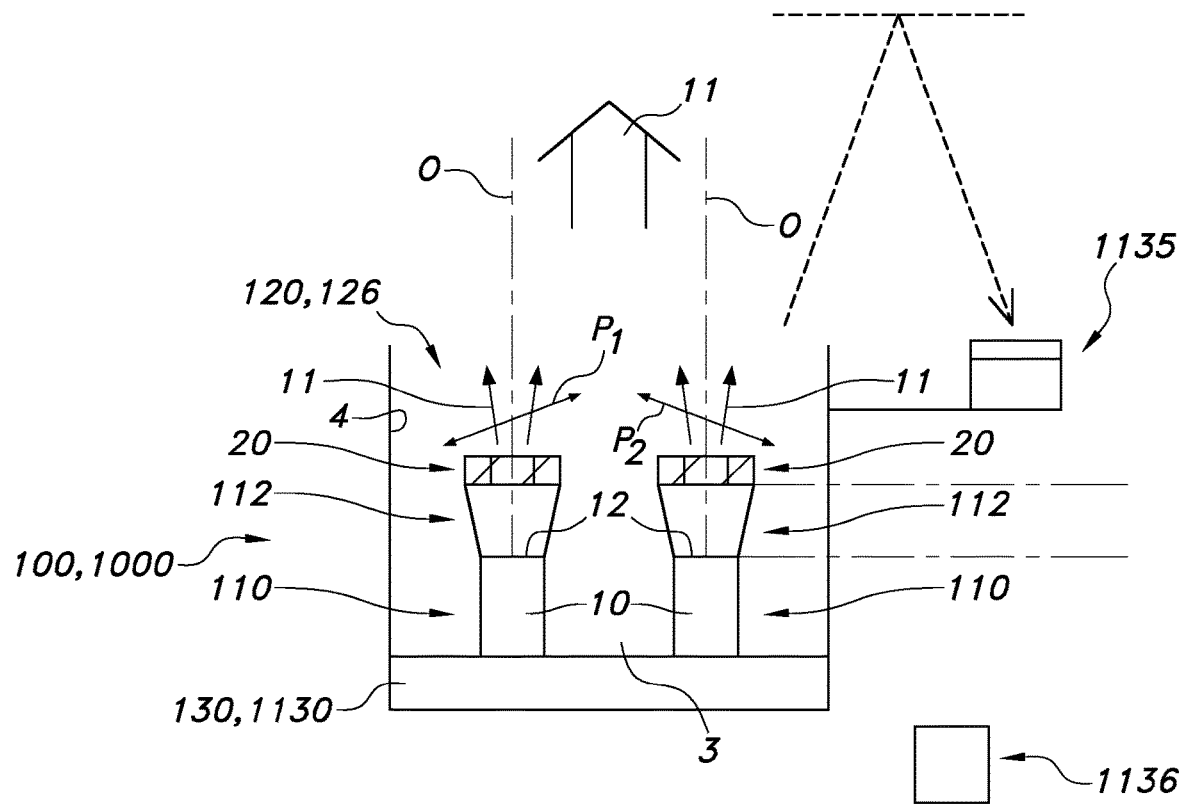

FIG. 1c schematically depicts a more or less similar embodiment as FIGS. 1a and 1b, but now with a lighting device opening 126 as light exit window 120. Further, by way of example also reflective optics are included to beam shape the (solid state) light source light 11. The optics are indicated with reference 112. Further, by way of example the lighting device 100 or the lighting system 1000 further comprises a user interface 1136 for providing user input data. The control system 1130 (or 130) is configured to control the light sources 10 in response to such user input data. In an alternative embodiment, the lighting device 100 or the lighting system 1000 further comprises a sensor 1135 configured to sense reflection of light from a remote object and configured to generate a corresponding sensor signal, wherein the control system is configured to control the light sources in response to said sensor signal.

Figure 2:
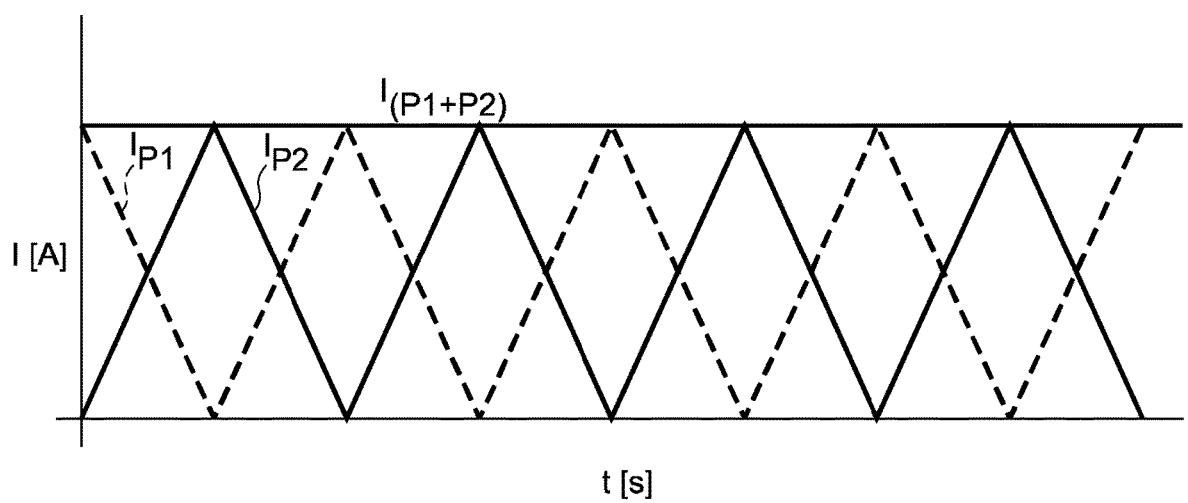
FIG. 2 schematically depicts a (operational driving) scheme.

In FIG. 2 an example of a modulating polarization in which an equal overall light intensity is maintained is given, leading to polarization based effects without disturbance due to intensity changes.

Figure 3A:
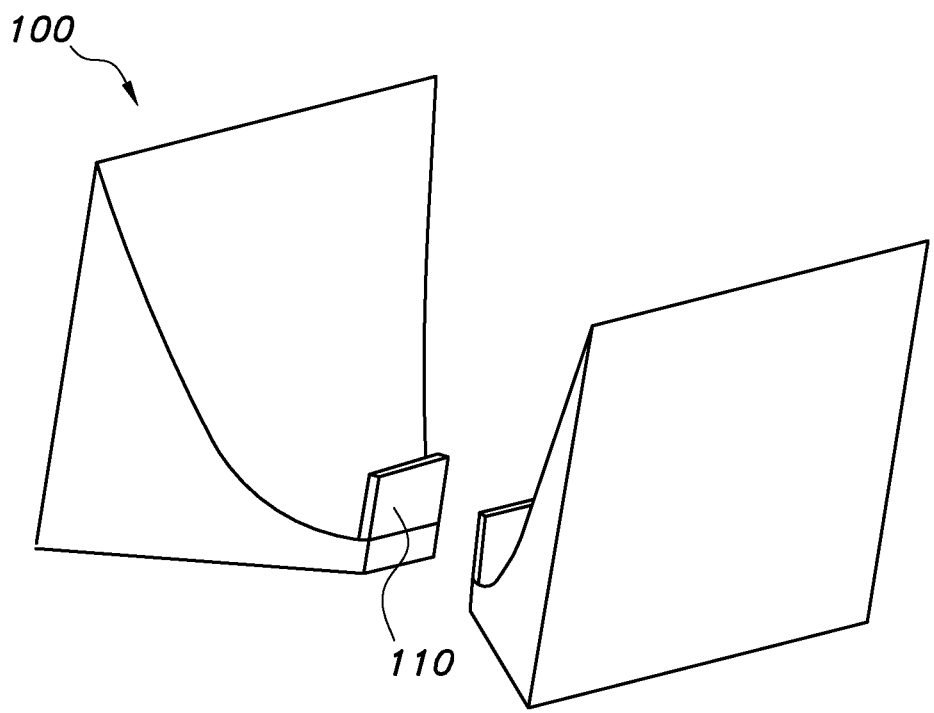
FIGS. 3a-3e schematically depicts some embodiments and variants.
Figure 3B:
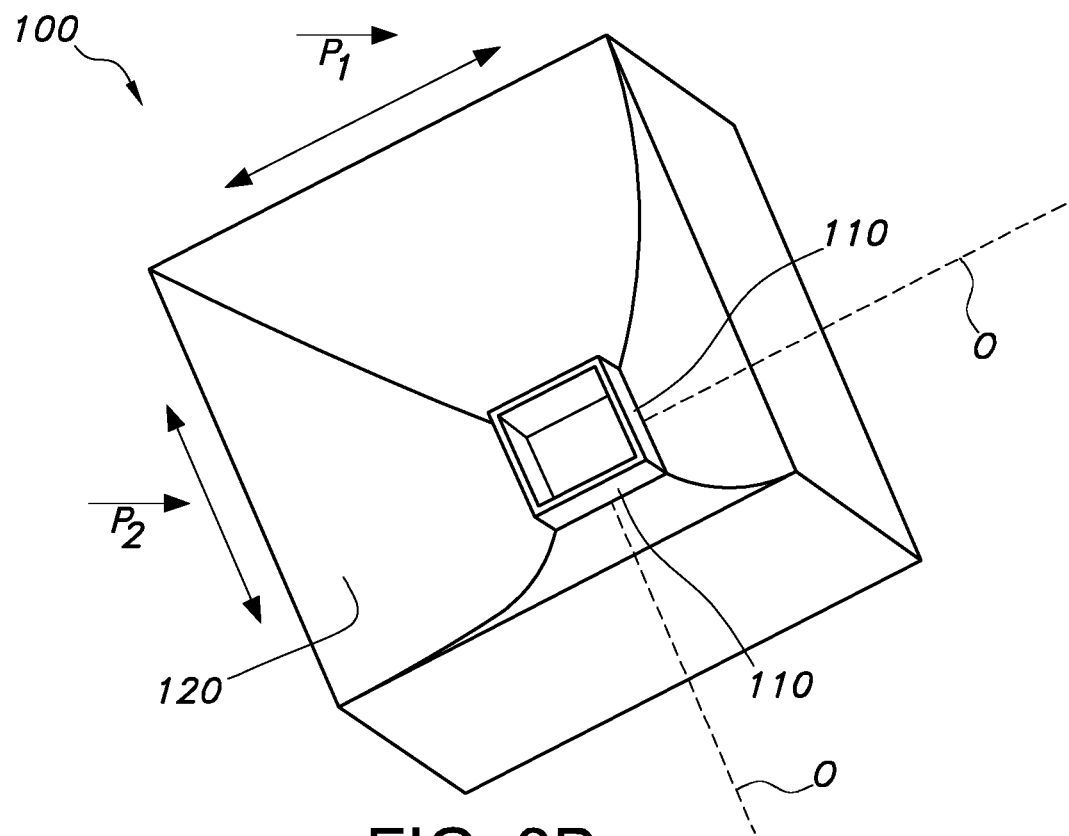
Figure 3C:
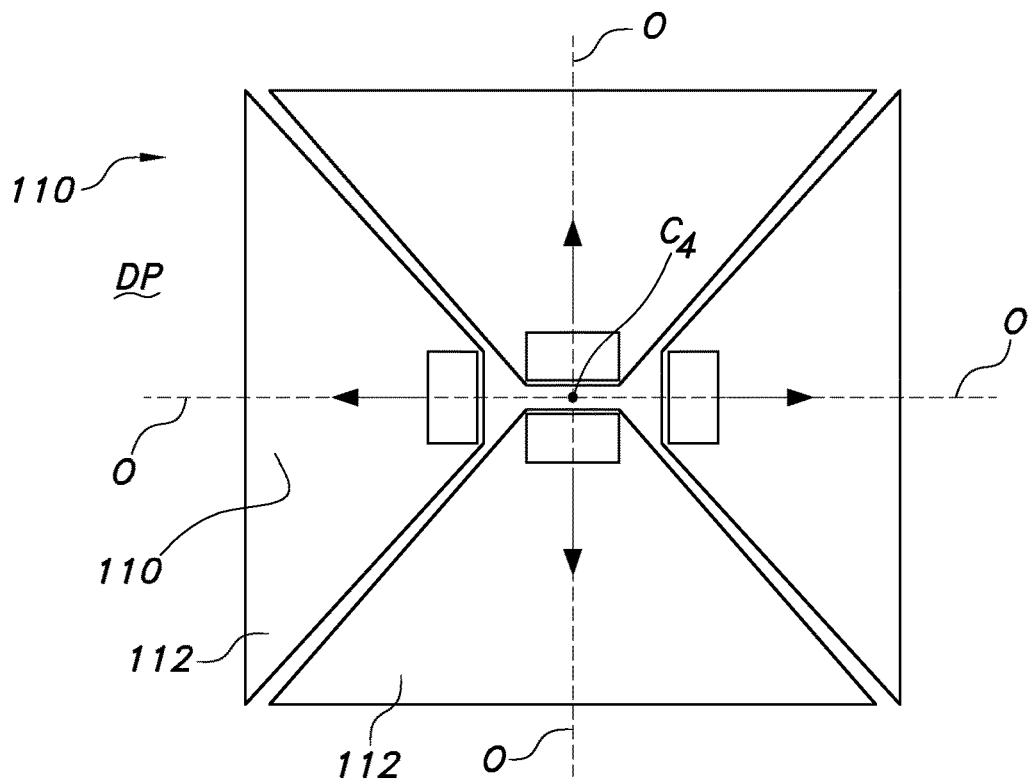

In an embodiment a module/spot light is described. A typical design of a spot with two directional polarizing units each composed of 2 basic elements is shown in FIG. 3a and FIG. 3b. Opposite units have equal polarization states P1 and P2. In FIG. 3c a top view outline is given of the assembly.

Figure 3D:
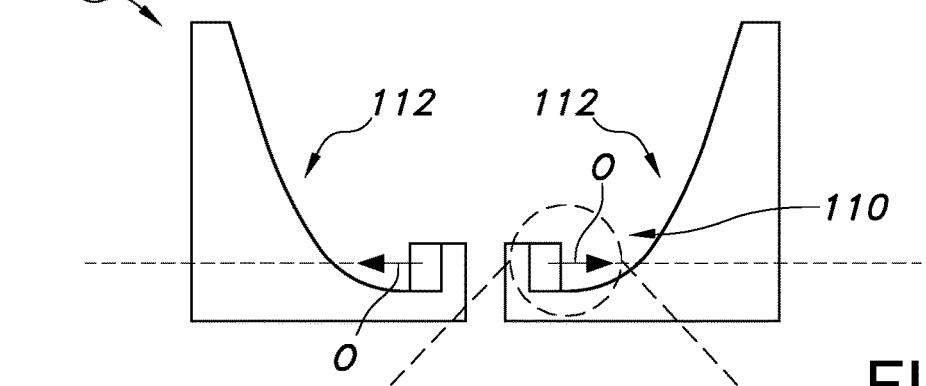
Figure 3E:
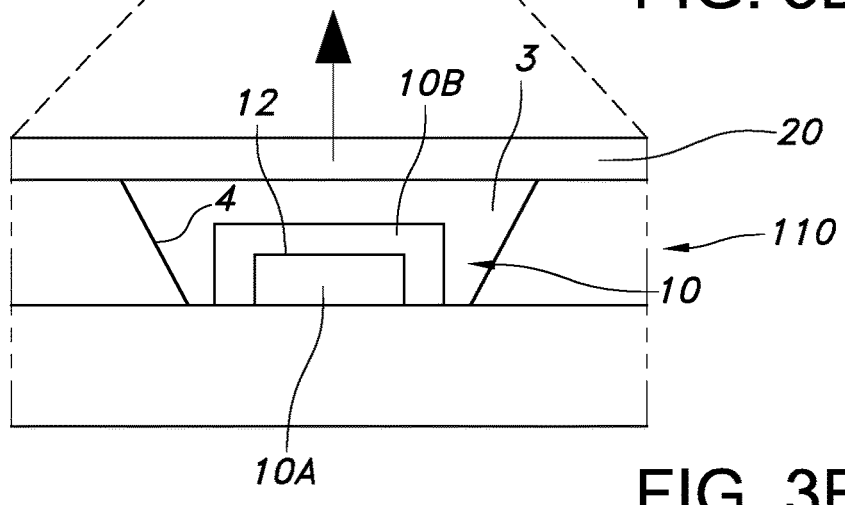

A hardware demonstrator was built, consisting of four white emitting LED light packages, with a reflective mix box and a polarizer platelet at the exit (represented by FIG. 4b), a substrate for routing to the LEDs, for addressing these LEDs individually (to allow dynamics), four identical individual reflector units that maintain the polarization from the polarizer, each containing one light source realizing a polarization state P. The reflectors are designed to achieve beam directionality. The position of the individual assemblies determine the polarization states various directions can be realized by specific geometries of these assemblies. Further, a base plate to clamp the individual units and realize the final module was used. FIG. 3a schematically depicts two building blocks which essentially consist of a parabolic type of reflector with a LED in its focal point. The parabolic type of reflector can be considered a segment of a parabolic reflector. FIG. 3b schematically depicts a four-unit polarized lighting device, resulting in two different polarizations p1 and p2. FIG. 3c-3e schematically depicts an outline of the spot with four units and with two polarization states, with FIG. 3a a top view, FIG. 3d a cross-sectional view, and with FIG. 3e schematically depicting a possible light source package 110 (note that FIG. 3e is an enlargement of the packages of FIG. 3d, but depicted rotated relative to 3d). Note that here the package comprises a cavity 3, with e.g. reflective walls 4. Further, the light source 10 comprises a solid state light source 10a with e.g. a luminescent material. In this way, with using a blue LED and a luminescent material 10b that can convert part of the blue light in yellow light, white light source light 11 may be generated, that is subsequently polarized with the polarizer 20, and at least partly beam shaped with the reflector 112. Note that FIG. 3c also shows the fourfold rotational symmetry axis. Would polarizations be taken into account, the axis becomes a two-fold rotational symmetry axis.

The module forms into a lamp (spot, luminaire) when combined with necessary wiring, drivers and mechanical envelope such as e.g. a casted plastic housing (not further depicted here). Various options are possible, ranging from luminaires with external driver and intelligence to fully integrated solutions with wireless access for remote programming and setting of the light scene. A typical assembly process (as we used for the demonstrator fabrication) consists of following steps (simplified):

1. Print solder on PCB substrate board
2. Pick & place LEDs.
3. Reflow soldering
4. Apply mix box around LED (by adhesive bonding)
5. Apply polarizer on mix box by gluing
6. Solder wires to the PCB
7. Apply the PCB in the reflector units (with combined screwing and adhesive bonding)
8. Assemble of reflector units in a clamping embodiment.

Figure 4A:
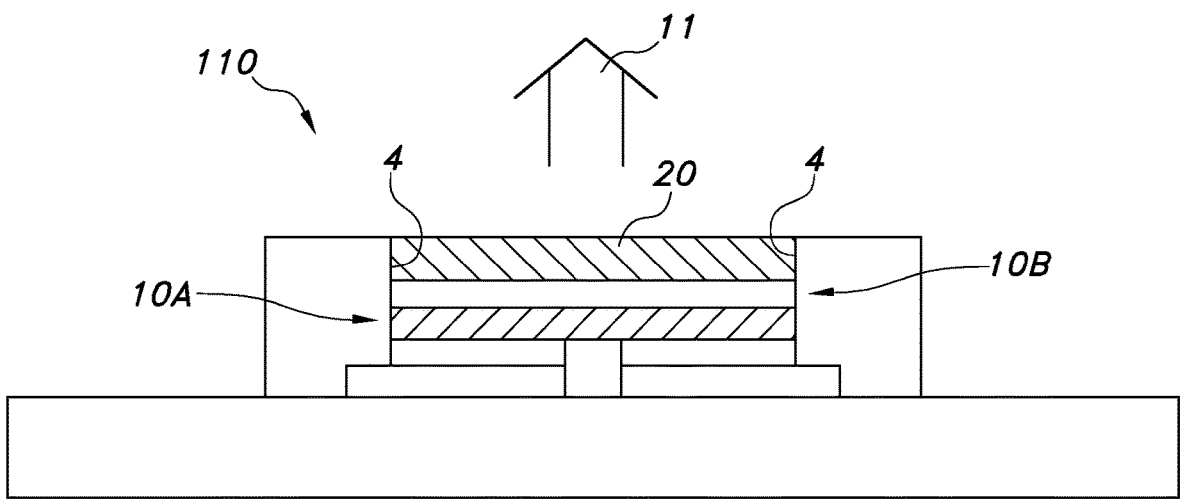
FIGS. 4a-4b schematically depict some further embodiments and variants.
Figure 4B:
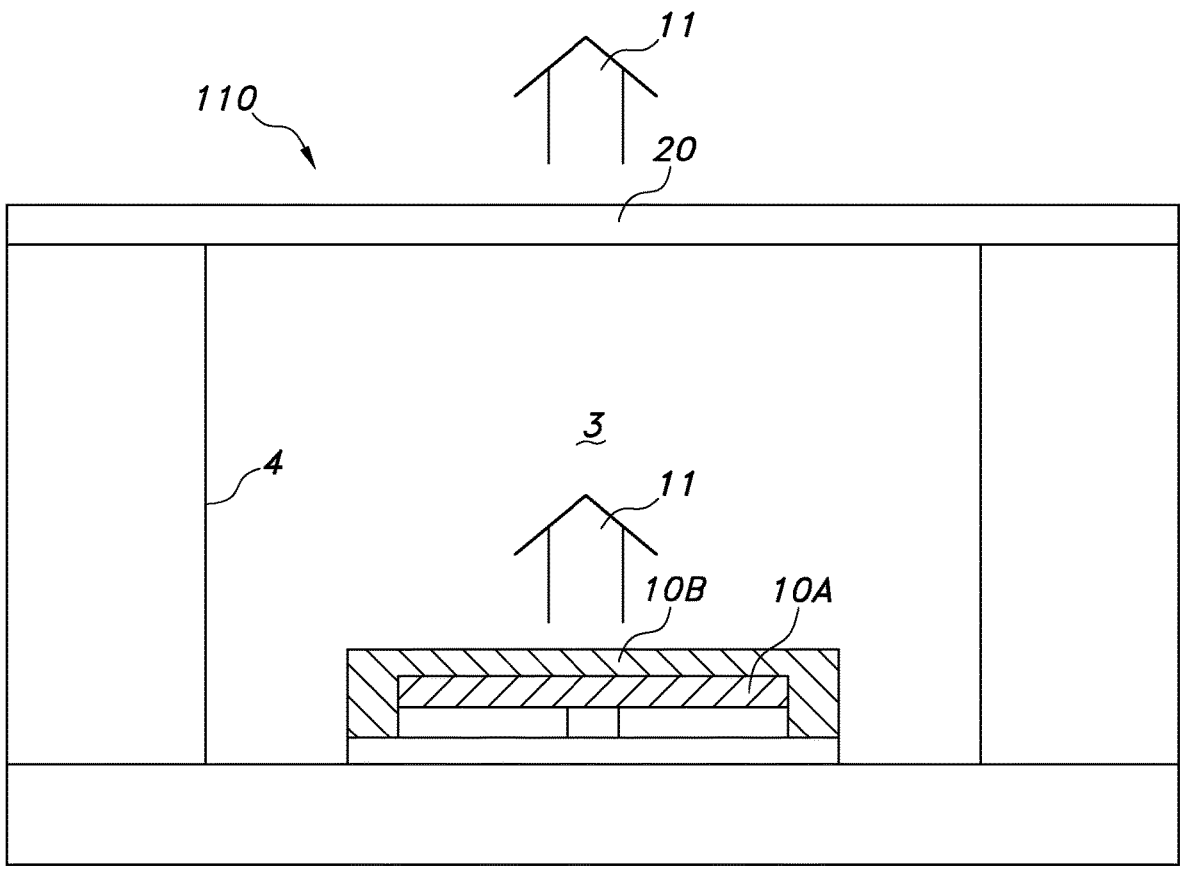

In case a pre applied polarizer can be used (as proposed in FIGS. 4a, 4b, steps 4 and 5 can be skipped).

Note that the optical beam shaping part is not limited to reflective optics. Refractive optics can also be applied, provided that non-birefringent materials are used for the lenses. This is for instance the case if silicone or glass is used for the lens material.

This demonstrator was arranged such that each of the two independently addressable polarization modes are projected with identical pattern. Good correlation with optical modelling results was found.

FIG. 4a schematically depicts an outline of a near-chip size or chip-size package LED emitter for polarized light, such as can be used in the embodiments schematically depicted in FIGS. 3a-3e. FIG. 4b schematically depicts an alternative outline of another embodiment for creating a micro collimating light source, such as can be used in the embodiments schematically depicted in FIGS. 3a-3e.

In the above embodiments we address a number of concepts and technical options for the fabrication of a polarized LED source with on-die or near-die (package level) applied metal wire grid polarizer platelet, such as shown in FIGS. 4a and 4b. These may also be indicated as LED package solutions.

Amongst others, an On-die solution may be provided. For instance, in this embodiment the polarizing glass platelet is mounted in direct contact with the light converting phosphor layer that is applied on the blue die. This leads to the ultimate miniaturization and maintenance of brightness by the realization of a Chip Size or near-chip size package. Optionally a reflective (or absorbing) side coating can be applied, on die level or after mounting the die, for preventing side emission of non-polarized light.

Amongst others, also a package/mix box solution is provided. In a package or mix box solutions the light is, after conversion to white, recycled in a mix box (in either the package cavity or in an additional mix box body or cup) and directed to the polarizer platelet at the exit of the mix box.

Figure 5A:
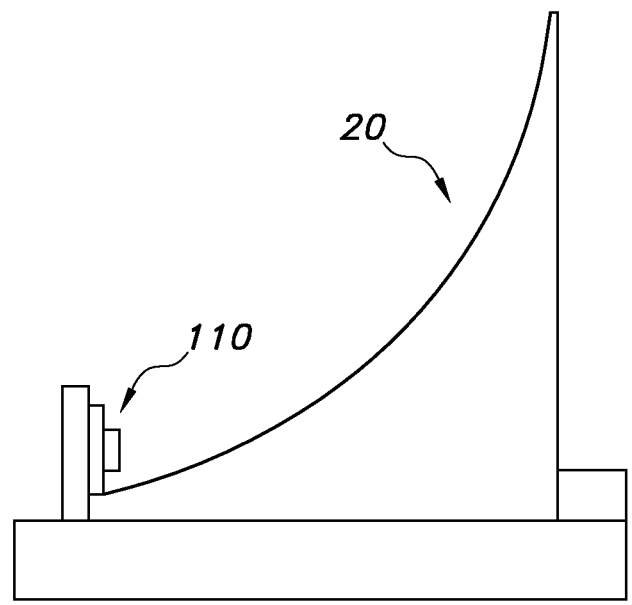
FIGS. 5a-5b schematically depict some further embodiments and variants.
Figure 5B:
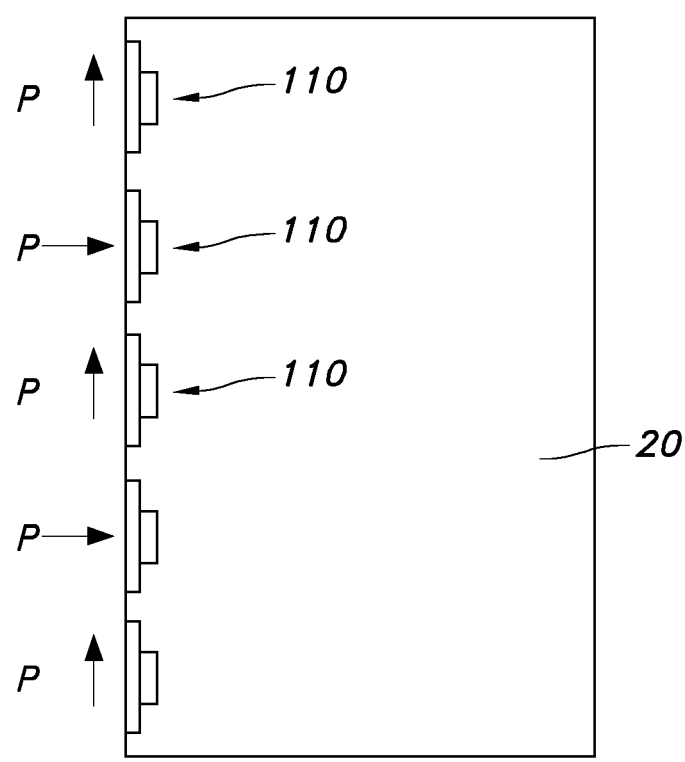

It is clear that the number of polarizing units is not restricted to 4 (2×2). Any realistic number can be applied and will have its additional merits in terms of functionality and visual effect. Alternative geometries can also be realized. As an alternative a LED array to illuminate e.g. a showcase (TL-like aspect ratio) can also be realized, as shown in FIGS. 5a-5b. In this example the individual LEDs in the array can provide a pre-defined polarization state that can be individually addressed. These figures show an alternative layout of a linear shaped polarized light source, with FIG. 5a a side view and FIG. 5b a top view. The individual LEDs have different individual addressable polarization states.

Also embodiments with deviating, asymmetric, multiple angle, etc. beam shaping elements should be considered as covered by the invention.

Polarized illumination may realize a new illumination experience. With our invention we can dynamically change or modulate these different scenes. An application example may include retail lamp in supermarket (e.g. used for illuminating foil packed meat, foil packed cheese), e.g. for taking away glare to make the product look more attractive (allow a look-through-the-package perception). An application example may include retail lamp in supermarket (e.g. illumination in front of vitrines), e.g. for preventing unwanted reflections of the light on the window of the vitrine. An application example may include illuminating lamps in museums (e.g. improving contrast by taking away glare caused by varnish in paintings). An application example may include retail lamp in shops (e.g. adjustable polarizing direction to optimize the looks of the product), e.g. for setting a scene to optimize the contrast for clothing, for remote setting the scene (e.g. like a "hue-like" polarizing lamp, where the shop owner can stand in front of his shop window to optimize the scene remotely), for modulating polarization (e.g. by modulating the polarization in an alternating mode, a "wavy-like" effect can be generated, bringing the products to live and attract the attention by addressing the LEDs in a certain sequence, for providing a twinkling/sparkling effect (e.g. rapid changes in polarizing frequency can establish a twinkling/sparkling effect (e.g. a random pulse frequency in alternation polarizing modes)). In particular materials containing optical diffractive materials (e.g. glass particles), etc. can contribute to the mentioned sparkling effects. An application example may include outdoor illumination of objects and buildings to create twinkling/special effects. An application example may include outdoor luminaire for street lighting. An application example may include outdoor luminaire for use where water reflection is a key element in human vision, e.g. in water traffic, at sea and in e.g. canals (e.g. for optimizing maneuvering at/in canal locks during evening and night) or in harbors with ship maneuvering in swimming pool (e.g. to ease safety observation by pool guards). Yet another example is an outdoor luminaire with tunable polarization that allows highlighting on-the-road or near-the-road signs (such as linings on the road/road markings or traffic signs), etc. etc.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to". The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device configured to provide white light, comprising a plurality of light source packages each light source package comprising a light source configured to provide white light source light and a polarizer configured to polarize the white light source light of said light source, wherein the light source packages are individually controllable, wherein the light source packages are configured to provide polarized light source light with at least two different polarization states (p1,p2), wherein a first light source package is configured to provide polarized light of a first polarization state and a second light source package is configured to provide polarized light of a second polarization state, wherein the light source packages share a light exit window for escape of the light source light from said lighting device,
   wherein each light source package further comprises a reflector, wherein each light source package and the respective reflector are configured to reflect at least part of the white light source light in a direction of the light exit window; and
   where a sum of the intensities of the light of the at least two polarization states is maintained constant in time but the individual intensities are varied in time.

2. The lighting device according to claim 1, wherein the light sources have optical axes (O), wherein the light sources are configured in a virtual device plane (DP), wherein the optical axes (O) of the light sources are configured non-perpendicular to said virtual device plane (DP).

3. The lighting device according to claim 2, wherein the optical axes (O) are/is configured parallel to said virtual device plane (DP).

4. The lighting device according to claim 1, comprising n light source packages, wherein the n light source packages are configured in a predetermined symmetry, and wherein n is an integer of at least 2.

5. The lighting device according to claim 4, wherein n=2k, wherein the light source packages are configured to provide linearly polarized light source light, and wherein k is an even number.

6. The lighting device according to claim 1, wherein the light exit window comprises a non-birefringent refractive optics.

7. The lighting device according to claim 1, wherein the light exit window comprises one or more of a silicone or glass dome and a lighting device opening.

8. The lighting device according to claim 1, wherein the light sources comprise light emitting surfaces, wherein the polarizers of one or more light sources are configured at a distance (d1) from the respective light emitting surface selected from the range of 0-20 mm, and wherein the light source packages are configured to provide white light source light.

9. The lighting device according to claim 1, wherein one or more polarizers comprise wire grid polarizers.

10. A lighting system comprising the lighting device according to claim 1 and a control system configured to control the light sources.

11. The lighting system according to claim 10, wherein the control system is configured to control the light sources in response to one or more of a sensor signal and user input data.

12. The lighting system according to claim 10, further comprising a sensor configured to sense reflection of light from a remote object and configured to generate a corresponding sensor signal, wherein the control system is configured to control the light sources in response to said sensor signal.

13. The lighting system according to claim 10, further comprising a user interface for providing user input data, wherein the control system is configured to control the light sources in response to said user input data.

* * * * *